United States Patent [19]

Baker et al.

[11] Patent Number: 5,053,850
[45] Date of Patent: Oct. 1, 1991

[54] BONDING PAD FOR SEMICONDUCTOR DEVICES

[75] Inventors: Thomas R. Baker; George F. Anderson, both of Tempe, Ariz.

[73] Assignee: Motorola, Inc., Schaumburg, Ill.

[21] Appl. No.: 614,965

[22] Filed: Nov. 15, 1990

Related U.S. Application Data

[63] Continuation of Ser. No. 167,927, Mar. 14, 1988, abandoned.

[51] Int. Cl.$^5$ .............................................. H01L 33/00
[52] U.S. Cl. ........................................ 357/68; 357/65
[58] Field of Search ............................. 357/68, 53, 65

[56] References Cited

U.S. PATENT DOCUMENTS 4,864,370  9/1989  Gaw et al. ........................... 357/68

FOREIGN PATENT DOCUMENTS

| 57-40986 | 3/1982 | Japan | 357/17 |
| 57-97686 | 6/1982 | Japan | 357/17 |
| 57-197879 | 12/1982 | Japan . | |
| 59-29430 | 2/1984 | Japan | 357/68 |
| 60-4249 | 1/1985 | Japan | 357/65 |
| 0174659 | 8/1986 | Japan . | |
| 62-7161 | 1/1987 | Japan . | |
| 62-150776 | 7/1987 | Japan | 357/68 |
| 0176140 | 8/1987 | Japan | 357/68 |
| 0432661 | 9/1967 | Switzerland | 357/53 |
| 0436491 | 11/1967 | Switzerland | 357/53 |

*Primary Examiner*—Andrew J. James
*Assistant Examiner*—Viet Q. Nguyen
*Attorney, Agent, or Firm*—Charles R. Lewis

[57] ABSTRACT

A bonding pad is described having a reduced surface area while maintaining adequate wire bonding surface. The bonding pad comprises: a test pad for contacting with a test probe; a plurality of radially extending conductive fingers; and an alignment key generally in the form of a circle disposed about a portion of the fingers.

7 Claims, 1 Drawing Sheet

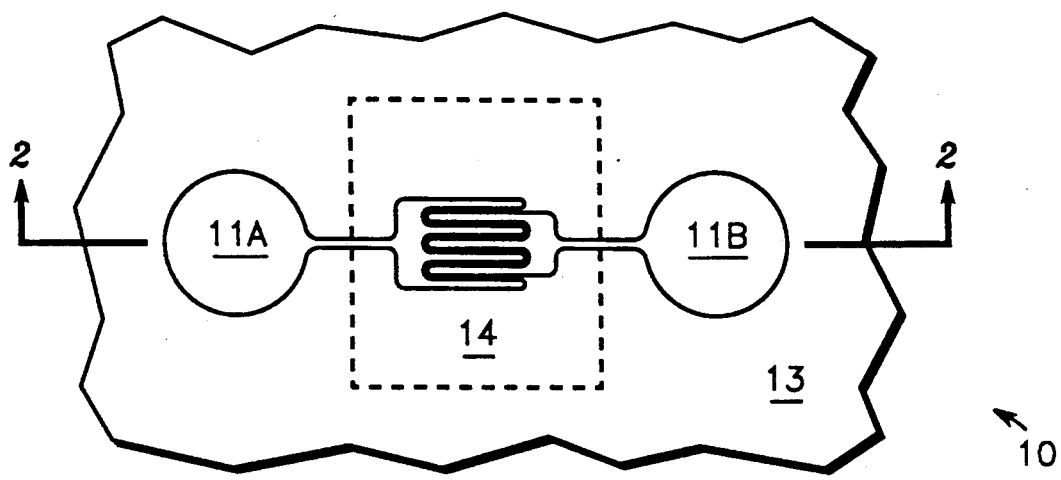
FIG. 1 —PRIOR ART—
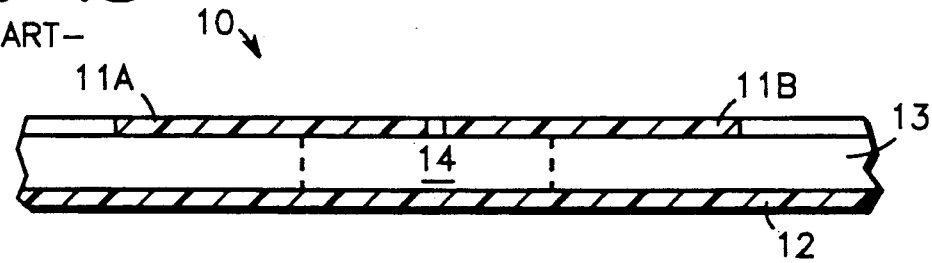
FIG. 2 —PRIOR ART—
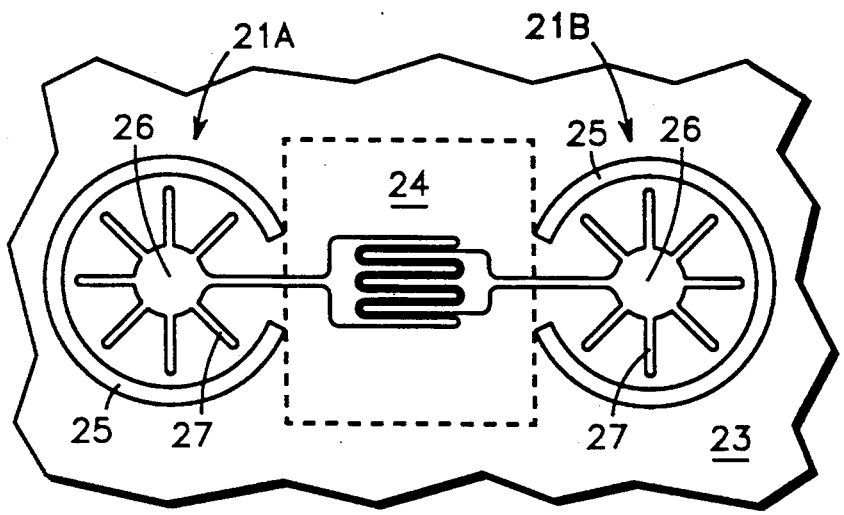
FIG. 3
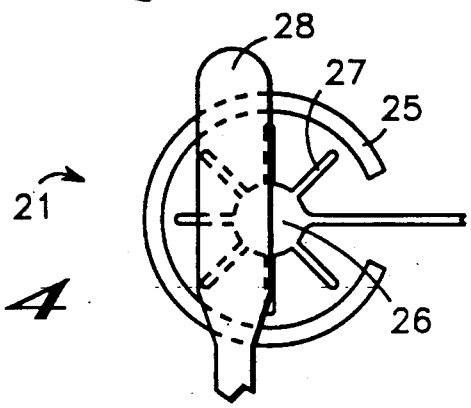
FIG. 4

BONDING PAD FOR SEMICONDUCTOR DEVICES

This application is a continuation of prior application Ser. No. 167,927, filed Mar. 14, 1988, now abandoned.

BACKGROUND OF THE INVENTION

The present invention relates, in general, to bonding pads, and, in particular, to bonding pads for semiconductor devices.

Bonding pads are well known in the art of semiconductor devices and are generally rectangular in shape. Bonding pads are used to bond a wire to the semiconductor device. The other end of the wire is connected to a lead of an external leadframe.

In many semiconductor devices, it is necessary to have a low MOS capacitance value. Existing bonding pad designs have an unacceptably high MOS capacitance resulting from their large surface area creating a capacitive coupling with the back metal of the device. This affects the speed and integrity of the signal being transmitted.

Accordingly, it is an object of the present invention to provide a bonding pad that will overcome the above deficiency.

A further object of the present invention is to provide a bonding pad that reduces the capacitance of the device.

Another object of the present invention is to provide a bonding pad with sufficient solid area for needle placement during probe testing.

Still another object of the present invention is to provide a bonding pad having an alignment key.

Yet another object of the present invention is to provide a bonding pad covering an area sufficient to compensate for alignment variations in the wire bonding equipment.

SUMMARY OF THE INVENTION

A particular embodiment of the present invention comprises: a solid area bonding pad having sufficient area to permit test probing; and a plurality of conductive fingers coupled to and extending radially from the solid area bonding. The invention further comprises an alignment key in the form of a circle, rectangle, or other shape to denote a geometric location disposed in a spaced relation about the solid area bonding pad and conducting fingers.

BRIEF DESCRIPTION OF THE DRAWINGS

FIG. 1 is a top view of a portion of a semiconductor device embodying a prior art bonding pad;

FIG. 2 is a cross-sectional view of the device of FIG. 1;

FIG. 3 is a top view of a portion of a semiconductor device embodying the present invention; an FIG. 4 is a top view of a wire bonded to a bonding pad embodying the present invention.

DETAILED DESCRIPTION OF THE INVENTION

Referring first to FIGS. 1 and 2, portions of a semiconductor device, generally designated 10, embodying a pair of prior art bonding pads 11a and 11b, is illustrated. Pads 11 provide contact to the emitter and base contacts of semiconductor device 10. Semiconductor device 10 has a back metal layer 12. Located between pads 11 and back metal 12 is a semiconductive layer 13 having a device area 14.

As illustrated in FIG. 2, pads 11 and back metal 12 are in close proximity to each other. This permits a capacitive coupling to occur which can effect the transmission of signals to and from device area 14. To reduce this capacitance, the size of the pad would have to be reduced. However, because of variances in the wire bonding equipment, a large bonding area must be provided.

Referring now to FIG. 3, a top view of a portion of a semiconductor device, generally designated 20, embodying the present invention is illustrated. Device 20 consists of a body of semiconductor material 23 having a device area 24. Disposed on material 23 are bonding pads 21a and 21b. Pads 21 are provided to allow for coupling to the emitter and/or base contacts of device 24. It should be noted here that this invention is not limited to those devices having only emitter and base contacts. Pads 21 each contain a test pad 26, a plurality of radially extending fingers 27, and an alignment key 25.

Pads 21 have the advantage of not having as much conductive surface area with which to form a capacitive connection with the base metal. In addition, the area required to be covered by pads 21, to compensate for tolerances in the wire bonding equipment, is maintained by the radially extending fingers 27. Further, test pad 26 provides the surface required for contact by testing probes used to test devices 24 prior to wire bonding.

Dimensionally, one particular embodiment of pad 21 has a diameter of 1.5 mils with the diameter of test pad 26 being approximately 0.75 mils for a surface area of about 0.44 square mils. Seven conductive fingers 27 are illustrated in FIG. 3 extending from test pad 26. Each finger is approximately 0.375 mils in length and 0.15 mils in width for a surface area of about 0.056 square mils. The seven fingers 27 total a surface area of about 0.40 square mils or about half of the total surface of the pad 21. The surface area of pad 21 is calculated to be approximately 0.87 mils$^2$. As can be appreciated by a comparison of the surface area of pad 21 to the surface area, 1.77 mils$^2$, of a 1.5 mil diameter circle, pad 21 provides a greatly reduced (50%) surface area. This functions to reduce the amount of capacitive coupling present.

An example of a wire 28 bonded to a pad 21 is illustrated in FIG. 4. As shown, wire 28 is not centered on test pad 26. However, because of fingers 27, enough of pad 21 is contacted to provide a good electrical connection.

Alignment key 25 of FIGS. 3 and 4 is provided for visual inspection of device 20. Alignment key 25 is made of a material that is visually distinguishable from the background. This allows inspection of the wire bond to determine if wire 28 is within key 25. As a metal layer is generally deposited to form pads 21, key 25 can also be formed by the same metallization step. This metal key 25 is then coated prior to wire bonding to prevent electrical contact between wire 28 and key 25.

Thus, it will be apparent to one skilled in the art that there has been provided in accordance with the invention, a device that fully satisfies the objects, aims, and advantages set forth above.

While the invention has been described in conjunction with specific embodiments thereof, it is evident that many alterations, modifications, and variations will be apparent to those skilled in the art in light of the forego-

What is claimed is:

1. A low capacitance bonding pad for use with a semiconductor device comprising:
   a conductive test pad disposed on a surface of said semiconductor device;
   a plurality of finger-like conductors coupled to said test pad and extending outwardly from said test pad to compensate for alignment variations in wire bonding equipment;
   said bonding pad having a total surface area of no more than one square mil; and
   a slender alignment key substantially encircling said plurality of finger-like conductors.

2. The bonding pad of claim 1 wherein said conductive test pad is coupled to an electrically active portion of said semiconductor device.

3. The bonding pad of claim 2 wherein said electrically active portion is an emitter, a base, or a collector.

4. The bonding pad of claim 1 wherein the total surface area of said plurality of finger-like conductors is about the same as the surface area of said test pad.

5. The bonding pad of claim 1 wherein said test pad has a surface area of less than one-half of a square mil.

6. The bonding pad of claim 1 wherein said plurality of said finger-like conductors have a total surface area less than one-half of a square mil.

7. The bonding pad of claim 1 wherein said test pad has a diameter of about 0.75 and said fingers have a length of about 0.375 mils and a width of about 0.15 mils.

* * * * *